United States Patent
Fukuda (10) Patent No.: US 12,225,671 B2
(45) Date of Patent: Feb. 11, 2025

(54) ELECTRONIC CONTROL UNIT CAPABLE OF SUPPRESSING AN INCREASE IN SIZE OF A BOARD

(71) Applicant: Hitachi Astemo, Ltd., Hitachinaka (JP)

(72) Inventor: Tomohiro Fukuda, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 377 days.

(21) Appl. No.: 17/642,872

(22) PCT Filed: Aug. 14, 2020

(86) PCT No.: PCT/JP2020/030853
§ 371 (c)(1),
(2) Date: Mar. 14, 2022

(87) PCT Pub. No.: WO2021/059792
PCT Pub. Date: Apr. 1, 2021

(65) Prior Publication Data
US 2022/0400560 A1    Dec. 15, 2022

(30) Foreign Application Priority Data

Sep. 26, 2019   (JP) ................. 2019-176097

(51) Int. Cl.
*H05K 5/00*   (2006.01)
*H02M 7/00*   (2006.01)
(Continued)

(52) U.S. Cl.
CPC ......... *H05K 5/0069* (2013.01); *H05K 1/0207* (2013.01); *H05K 1/144* (2013.01);
(Continued)

(58) Field of Classification Search
CPC .... H05K 5/0069; H05K 1/0207; H05K 1/144; H05K 7/14322; H05K 2201/0191;
(Continued)

(56) References Cited

U.S. PATENT DOCUMENTS

| | | | |
|---|---|---|---|
| 8,646,568 B2 * | 2/2014 | Yamasaki | H02K 11/33 |
| | | | 180/443 |
| 2014/0265749 A1 * | 9/2014 | Motoda | H02K 11/30 |
| | | | 310/68 R |

(Continued)

FOREIGN PATENT DOCUMENTS

| | | | |
|---|---|---|---|
| JP | 2005050848 A | * | 2/2005 |
| JP | 2009-43521 A | | 2/2009 |

(Continued)

OTHER PUBLICATIONS

English translated abstract of JP2005050848A (Year: 2005).*

(Continued)

*Primary Examiner* — Abdullah A Riyami
*Assistant Examiner* — Amara Anderson
(74) *Attorney, Agent, or Firm* — Crowell & Moring LLP (57) ABSTRACT

An electronic control unit includes a connector, a first board, and a second board. The first board includes an inner-layer conductor. The second board includes an inner-layer conductor and provided with a control circuit. A thickness of the inner-layer conductor of the first board is thicker than a thickness of the inner-layer conductor of the second board. The thickness of the inner-layer conductor of the first board is 1.7 to 2.3 times the thickness of the inner-layer conductor of the second board.

11 Claims, 6 Drawing Sheets

(51) Int. Cl.
  *H02M 7/44* (2006.01)
  *H05K 1/02* (2006.01)
  *H05K 1/14* (2006.01)

(52) U.S. Cl.
  CPC .............. *H02M 7/003* (2013.01); *H02M 7/44* (2013.01); *H05K 2201/0191* (2013.01); *H05K 2201/042* (2013.01); *H05K 2201/10189* (2013.01)

(58) Field of Classification Search
  CPC ... H05K 2201/042; H05K 2201/10189; H05K 2201/09027; H02M 7/003; H02M 7/44
  See application file for complete search history.

(56) References Cited

U.S. PATENT DOCUMENTS

| 2017/0237311 A1 | 8/2017 | Sakai et al. |
| 2018/0201302 A1 | 7/2018 | Sonoda et al. |

FOREIGN PATENT DOCUMENTS

| JP | 2016-63625 A | 4/2016 |
| JP | 2017-152389 A | 8/2017 |
| JP | 2019-88101 A | 6/2019 |
| WO | WO 2017/046940 A1 | 3/2017 |
| WO | WO 2018/061073 A1 | 4/2018 |

OTHER PUBLICATIONS

English translated description of JP2005050848A (Year: 2005).*
International Search Report (PCT/ISA/210) issued in PCT Application No. PCT/JP2020/030853 dated Oct. 6, 2020 with English translation (four (4) pages).
Japanese-language Written Opinion (PCT/ISA/237) issued in PCT Application No. PCT/JP2020/030853 dated Oct. 6, 2020 (three (3) pages).

* cited by examiner

ELECTRONIC CONTROL UNIT CAPABLE OF SUPPRESSING AN INCREASE IN SIZE OF A BOARD

TECHNICAL FIELD

The present invention relates to an electronic control unit.

BACKGROUND ART

An electronic control unit that controls driving of an electric power steering device mounted on a vehicle is disclosed in PTL 1, for example. The electronic control unit disclosed in PTL 1 includes a case, a cover bonded to the case, a drive circuit board and a control circuit board accommodated between the case and the cover, and an electrical connector. The drive circuit board drives an electric motor, and the control circuit board controls driving of the drive circuit board. The electrical connector supplies power and the like to the drive circuit board, the control circuit board, and the electric motor.

CITATION LIST

Patent Literature

PTL 1: JP 2017-152389 A

SUMMARY OF INVENTION

Technical Problem

However, in the electronic control unit disclosed in PTL 1, the drive circuit board is formed based on a plate made of a metal material. Therefore, the number and types of wiring patterns provided on the drive circuit board are restricted. In addition, in order to increase the number of wiring patterns, it is necessary to increase an area of a metal material plate as a base, which leads to an increase in size of the drive circuit board and the electronic control unit.

An object of the present invention is to provide an electronic control unit capable of suppressing an increase in size of a board in consideration of the above problems.

Solution to Problem

In order to solve the above problems and achieve the object of the present invention, an electronic control unit of the present invention includes a connector including a power supply terminal, a first board, and a second board. The first board includes an inner-layer conductor, and a power conversion circuit that converts input power input via a power supply terminal into predetermined output power is mounted thereon. The second board includes an inner-layer conductor, and mounted with a control circuit is mounted thereon. A thickness of the inner-layer conductor of the first board is thicker than a thickness of the inner-layer conductor of the second board.

Advantageous Effects of Invention

According to the electronic control unit having the above configuration, it is possible to suppress an increase in size of the board.

Problems, configurations, and effects other than those described above will be clarified by the following description of embodiments.

DESCRIPTION OF EMBODIMENTS

1. Embodiment

Hereinafter, an electronic control unit according to an embodiment of the present invention will be described. In the drawings, the same members are denoted by the same reference numerals.

[Electric Power Steering Device]

First, a configuration of an electric power steering device 1 as an example to which an electronic control unit according to an embodiment of the present invention is applied will be described with reference to FIG. 1.

Figure 1:
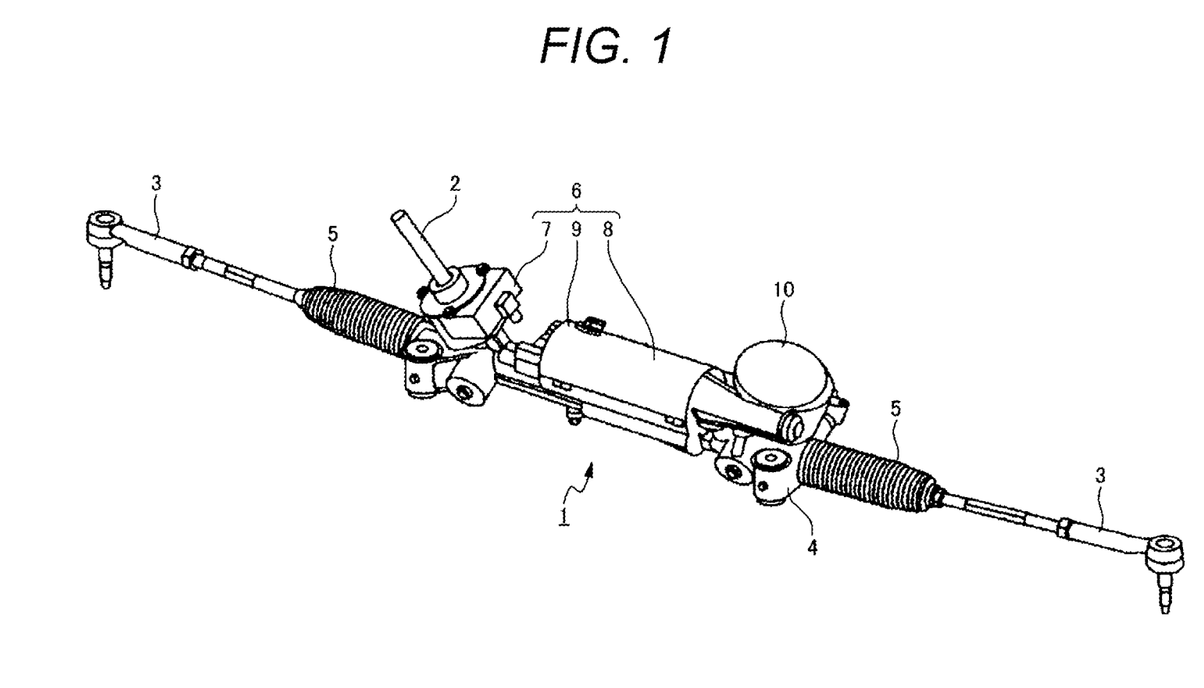
FIG. 1 is a perspective view of an electric power steering device to which an electronic control unit according to an embodiment of the present invention is applied.

FIG. 1 is a perspective view of an electric power steering device to which an electronic control unit according to an embodiment of the present invention is applied.

As illustrated in FIG. 1, the electric power steering device 1 is a device for steering a turning wheel (generally, front wheel) of an automobile, and includes a steering shaft 2, a tie rod 3, a rack housing 4, a rubber boot 5, an electric drive device 6, and a gear 10.

An upper end of the steering shaft 2 is connected to a steering wheel (not illustrated). A pinion (not illustrated) is provided at a lower end of the steering shaft 2. The pinion meshes with a rack (not illustrated) that is long in a left-right direction of a vehicle body. The tie rod 3 for steering the front wheels in the left-right direction is connected to both ends of the rack. The rack is covered by the rack housing 4. The rubber boot 5 is provided between the rack housing 4 and the tie rod 3.

The electric drive device 6 assists torque when the steering wheel is rotated. The electric drive device 6 includes a torque sensor 7, an electric motor unit 8 as an example of a "motor", and an electronic control unit 9. Hereinafter, the electronic control unit 9 is referred to as an ECU (electronic control unit) 9.

The torque sensor 7 detects a rotation direction and a rotation torque of the steering shaft 2. A plurality of portions of the outer peripheral portion of the electric motor unit 8 on the output shaft side are connected to the gear 10 via a bolt (not illustrated). The electric motor unit 8 applies steering assist force based on a detection value of the torque sensor 7 to the rack via the gear 10. An ECU 9 is provided at an end of the electric motor unit 8 on the side opposite to the output shaft side. The ECU 9 controls the electric motor disposed in the electric motor unit 8 to control driving of the electric motor unit 8. Note that the torque sensor 7 may be disposed separately from the electric drive device 6.

When the steering wheel is operated, the steering shaft 2 is rotated in any direction. At this time, the torque sensor 7 detects the rotation direction and the rotation torque of the steering shaft 2. The ECU 9 calculates the drive operation amount of the electric motor based on the detection value detected by the torque sensor 7.

A power switching element (not illustrated) of a power supply board 12 of the ECU 9 to be described later drives the electric motor based on a drive operation amount calculated by the ECU 9. As a result, the output shaft of the electric motor is rotated so as to drive the steering shaft 2 in the same direction as the operation direction. The rotation of the output shaft is transmitted from a pinion (not illustrated) to a rack (not illustrated) via a gear 10, and the vehicle is steered.

[Electronic Control Unit]

Next, a configuration of the ECU 9 will be described with reference to FIGS. 2 to 7.

Figure 2:
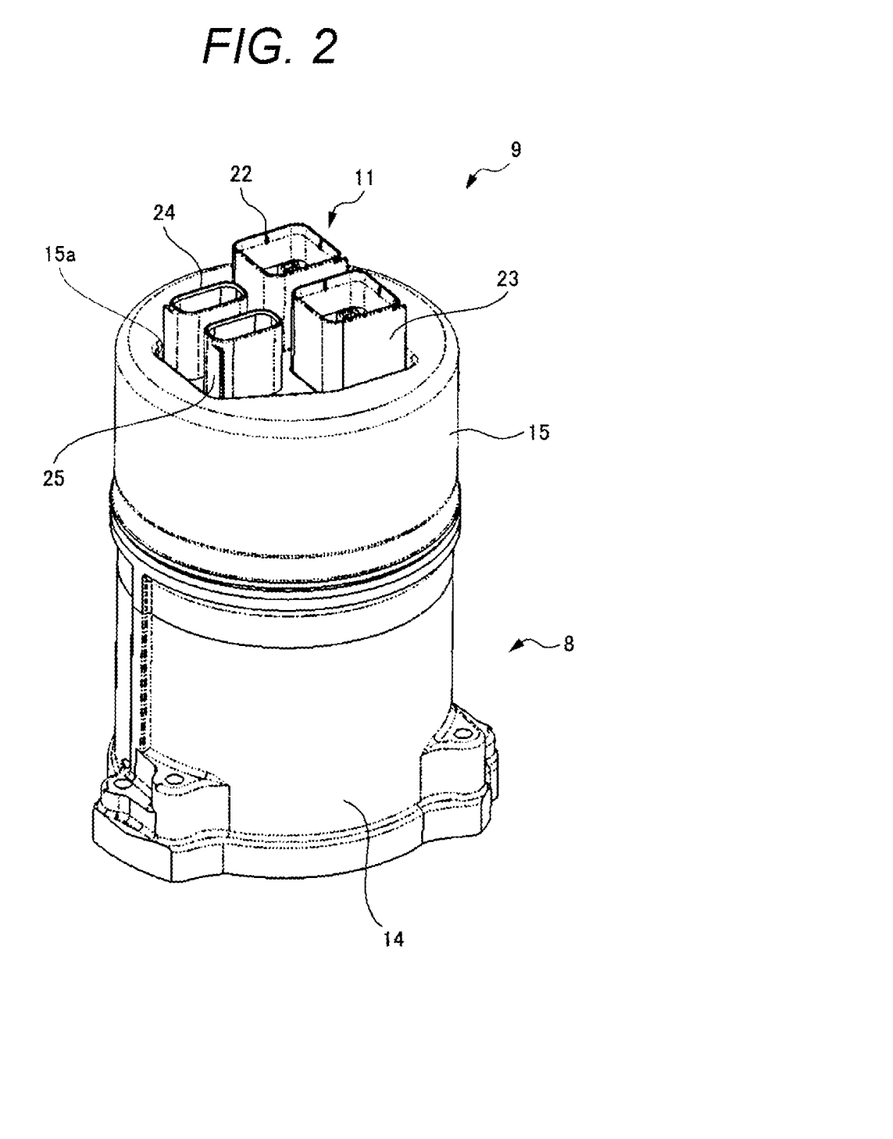
FIG. 2 is a perspective view of an electric drive device according to an embodiment of the present invention.
Figure 3:
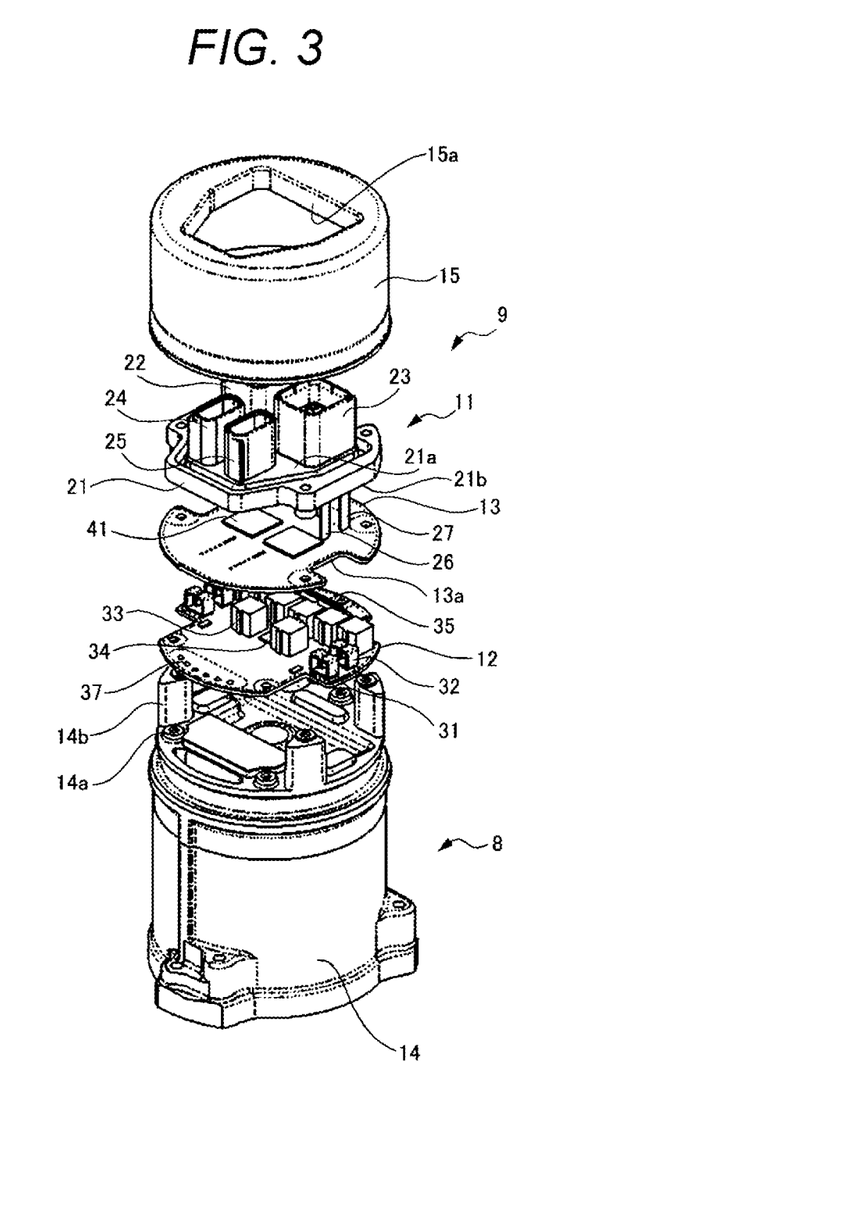
FIG. 3 is an exploded perspective view of the electric drive device according to the embodiment of the present invention.

FIG. 2 is a perspective view of the ECU 9 according to an embodiment of the present invention. FIG. 3 is an exploded perspective view of the ECU 9 according to the embodiment of the present invention. As illustrated in FIGS. 2 and 3, the ECU 9 includes a connector 11, a power supply board 12 illustrating an example of the first board according to the present invention, and a control board 13 illustrating an example of the second board according to the present invention.

The electric motor unit 8 includes a cylindrical motor housing 14 made of an aluminum alloy or the like, and an electric motor (not illustrated) housed in the motor housing 14. Since the specific structure of the electric motor is a known structure, the description thereof is omitted here. A coil input terminal of the electric motor is electrically connected to an output terminal of a power switching element (not illustrated) mounted on the power supply board 12 via a motor coil wire.

One axial end of the motor housing 14 is on the output shaft side of the electric motor unit 8. The other axial end of the motor housing 14 is provided with a board attachment portion 14a to which the power supply board 12 is attached, and a connector attachment portion 14b to which the connector 11 and the control board 13 are attached.

The board attachment portion 14a is formed on an end surface of the motor housing 14, and the connector attachment portion 14b is formed in a columnar shape protruding from the end surface of the motor housing 14. The control board 13 and the connector 11 are placed on the connector attachment portion 14b in this order, and the control board 13 and the connector 11 are fixed to the connector attachment portion 14b using a screw (not illustrated). Therefore, the control board 13 is disposed between the connector 11 and the power supply board 12.

A cover 15 that covers the connector 11, the power supply board 12, and the control board 13 is bonded to the other axial end of the motor housing 14. The cover 15 is formed in a bottomed cylindrical shape, and an inner peripheral surface on an opening side is fitted to an outer peripheral surface of the motor housing 14. A bottom portion of the cover 15 is formed with a through hole 15a through which connector housings 22 and 23 described later of the connector 11 protrude.

(Connector)

The connector 11 includes a flange 21, a pair of connector housings 22 and 23, and a pair of connector housings 24 and 25. The flange 21 is formed in a plate shape having an appropriate thickness, and has a first surface 21a and a second surface 21b. The first surface 21a of the flange 21 faces the bottom portion of the cover 15, and the second surface 21b faces the control board 13.

The pair of connector housings 22 and 23 and the pair of connector housings 24 and 25 are erected on the first surface 21a of the flange 21. The pair of connector housings 22 and 23 is formed in a cylindrical shape having a substantially square cross section. In addition, the pair of connector housings 24 and 25 is formed in a cylindrical shape having a substantially rectangular cross section.

Figure 4:
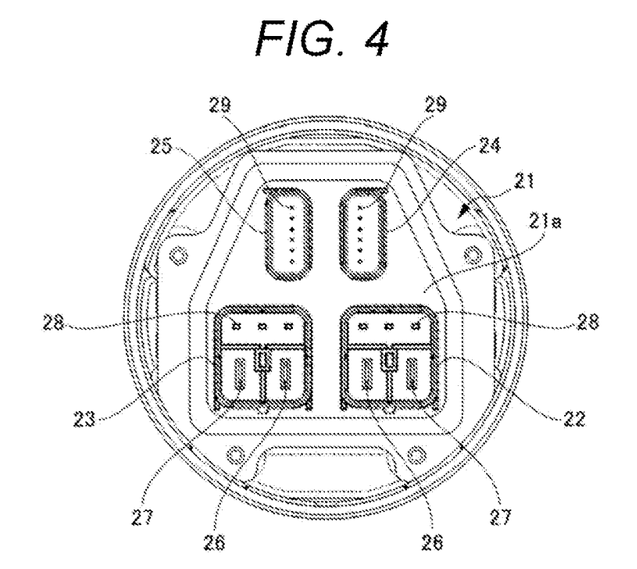
FIG. 4 is a top view of a connector according to an embodiment of the present invention.

FIG. 4 is a top view of a connector according to an embodiment of the present invention. As illustrated in FIG. 4, one end of a power supply terminal 26, one end of a GND terminal 27, and one ends of a plurality of CAN communication terminals 28 are disposed in the pair of connector housings 22 and 23, respectively.

The power supply terminal 26 and the GND terminal 27 are formed by bending an elongated plate-shaped copper material, and are arranged such that one ends thereof face each other in a specific direction (left-right direction in FIG. 4). The plurality of CAN communication terminals 28 are formed by bending a pin-shaped copper material, and one ends thereof are arranged at appropriate intervals in a specific direction.

In addition, one ends of a plurality of control terminals 29 for transmitting various signals (Torque/S, ignition SW, and the like) are arranged in the pair of connector housings 24 and 25. The plurality of control terminals 29 are formed in a pin shape, and have one ends arranged at appropriate intervals in a predetermined direction (vertical direction in FIG. 4) different from a specific direction. Note that the predetermined direction in the present embodiment is a direction orthogonal to a specific direction.

A connector fitting portion formed in an electrical connector of an external device (not illustrated) (for example, a power supply battery) is fitted into each of the connector housings 22 to 25, and one end of each of the terminals 26 to is electrically connected to a terminal formed in the electrical connector of the external device.

Figure 5:
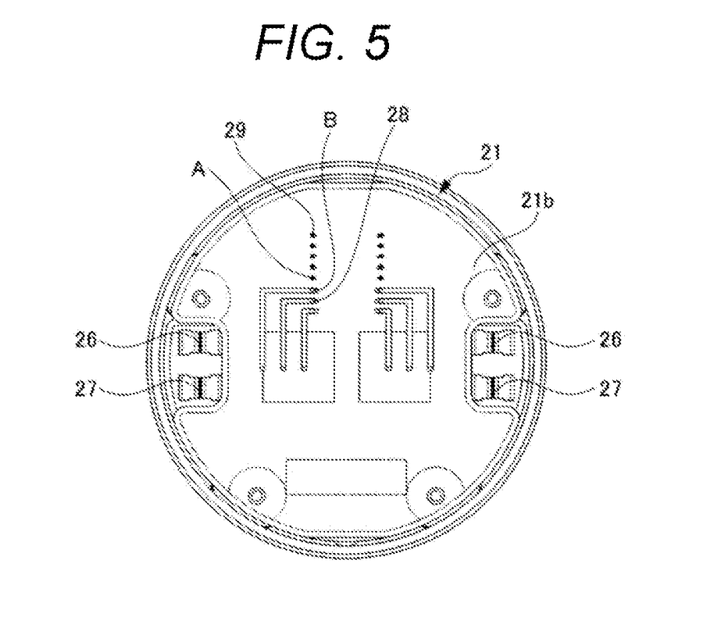
FIG. 5 is a bottom view of a connector according to an embodiment of the present invention.

FIG. 5 is a bottom view of a connector according to an embodiment of the present invention. As illustrated in FIG. 5, the other end of power supply terminal 26, the other end of GND terminal 27, the other ends of the plurality of CAN communication terminals 28, and the other ends of the plurality of control terminals 29 protrude from the second surface 21b of the flange 21.

The other end of the power supply terminal 26 and the other end of the GND terminal 27 are connected to a power supply terminal connecting portion 31 and a GND terminal connecting portion 32 (refer to FIG. 6), which will be described later, of the power supply board 12. The other ends of the plurality of CAN communication terminals 28 and the other ends of the plurality of control terminals 29 are connected to the control board 13 (refer to FIG. 3).

The other ends of the power supply terminal 26 and the GND terminal 27 are arranged to face each other in a predetermined direction (vertical direction in FIG. 5). The other ends of the plurality of control terminals 29 are arranged at appropriate intervals in a predetermined direction. In addition, the other ends of the plurality of CAN communication terminals 28 are arranged at appropriate intervals in a predetermined direction.

The other end A of the control terminal 29 disposed at one end of the other ends of the plurality of control terminals 29 in the predetermined direction is adjacent to the other end B of the CAN communication terminal 28 disposed at the other end of the other ends of the plurality of CAN communication terminals 28 in the predetermined direction. That is, the other ends of the plurality of control terminals 29 and the other ends of the plurality of CAN communication terminals 28 are arranged in a straight line.

The other ends of the plurality of control terminals 29 and the other ends of the plurality of CAN communication terminals 28 are positionally adjusted using an adjustment jig (not illustrated) and connected to the control board 13. In the present embodiment, since the other ends of the plurality of control terminals 29 and the other ends of the plurality of CAN communication terminals 28 are aligned in a straight line, the positions of the other ends of the terminals 28 and 29 can be adjusted with one adjustment jig. As a result, the other ends of the terminals 28 and 29 can be easily connected to the control board 13, and the assembly work of the ECU 9 can be facilitated.

(Power Supply Board)

As illustrated in FIG. 3, one surface (upper surface in FIG. 3) of the power supply board 12 faces the control board 13, and the other surface (lower surface in FIG. 3) abuts on the board attachment portion 14a of the motor housing 14. The power supply board 12 is fixed to the board attachment portion 14a using a screw or the like. Note that, heat dissipation grease may be applied between the power supply board 12 and the board attachment portion 14a.

On one surface of the power supply board 12, a power supply terminal connecting portion 31, a GND terminal connecting portion 32, a capacitor 33, a magnetic sensor 34, a female inter-board connector 35, a switching element (not illustrated), an FS relay/power choke coil, and the like are disposed. These electrical and electronic components constitute a power conversion circuit that converts input power input via the power supply terminal connecting portion 31 into predetermined output power. In the present embodiment, two systems of the power conversion circuit and the coil of the electric motor unit 8 are provided.

Figure 6:
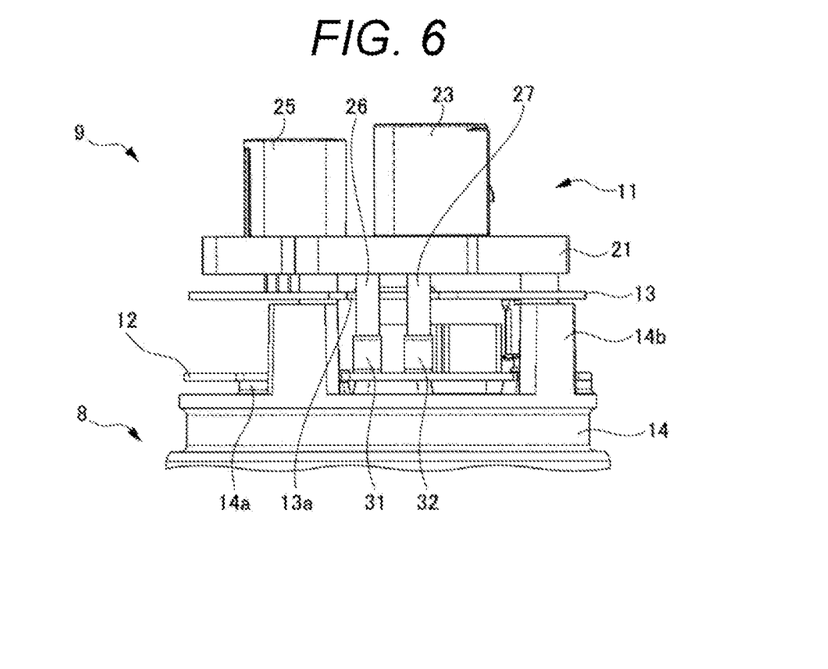
FIG. 6 is a side view of the electronic control unit according to the embodiment of the present invention.
Figure 7:
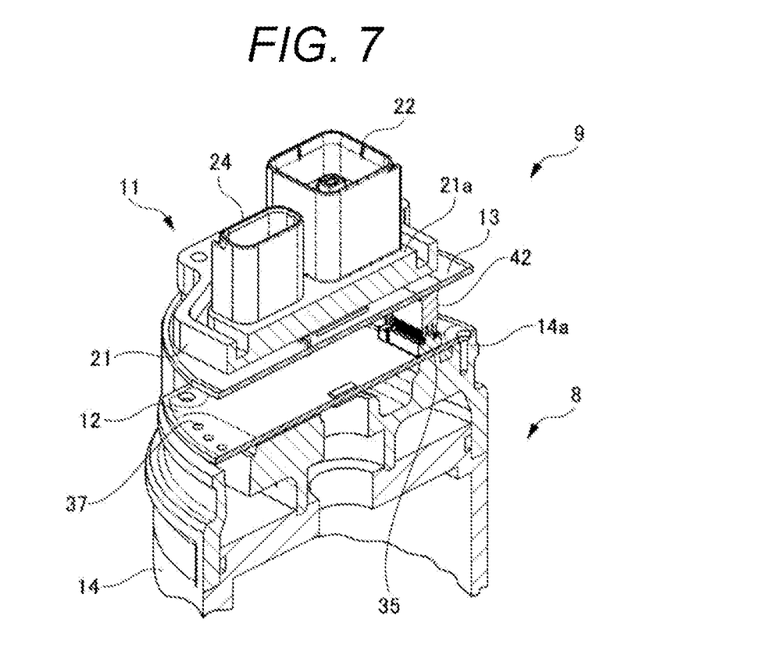
FIG. 7 is a longitudinal sectional view of an electronic control unit according to the embodiment of the present invention.

FIG. 6 is a side view of the ECU according to the embodiment of the present invention. FIG. 7 is a longitudinal sectional view of an electronic control unit according to the embodiment of the present invention. As illustrated in FIG. 6, the power supply terminal 26 is electrically connected to the power supply terminal connecting portion 31. The GND terminal is electrically connected to the GND terminal connecting portion 32. As illustrated in FIG. 7, a male inter-board connector 42 described later of the control board 13 is electrically connected to the female inter-board connector 35. The female inter-board connector 35 is a circuit component that electrically connects the power supply board 12 and the control board 13.

A switching element (not illustrated) converts a DC power supply into a three-phase AC power supply. The capacitor 33 includes an aluminum electrolytic capacitor or the like, and suppresses voltage fluctuation such as switching noise by charging and discharging. The magnetic sensor 34 is a sensor that detects a rotation angle of the electric motor.

The FS relay in the FS relay/power choke coil (not illustrated) is a circuit component that interrupts the current flowing through the electric motor when the ECU 9 fails, and the power choke coil is a circuit component that suppresses the propagation of the switching noise.

The power supply board 12 has a plurality of through holes 37. A coil lead wire (not illustrated) of the electric motor unit 8 is inserted through the plurality of through holes 37. A coil lead wire (not illustrated) of the electric motor unit 8 is electrically connected to an output terminal of a switching element (not illustrated).

(Control Board)

As illustrated in FIG. 3, one surface (upper surface in FIG. 3) of the control board 13 faces the connector 11, and the other surface (lower surface in FIG. 3) faces the one surface of the power supply board 12. The control board 13 is fixed to the connector attachment portion 14b together with the connector 11 using a screw or the like.

In the control board 13, an interference avoidance portion 13a for avoiding interference with the power supply terminal 26 and the GND terminal 27 is formed. In the present embodiment, the interference avoidance portion 13a is formed by providing the cutout of the control board 13. However, the interference avoidance portion according to the present invention may be formed by providing a through hole in the control board 13.

An integrated circuit 41 is mounted on one surface of the control board 13. The integrated circuit 41 illustrates a specific example of a control circuit according to the present invention. The integrated circuit 41 generates a control signal for controlling the electric motor in the electric motor unit 8 based on information (for example, steering torque, vehicle speed signal, and the like) input from the outside through the plurality of CAN communication terminals 28 and the plurality of control terminals 29 (refer to FIGS. 4 and 5). In the present embodiment, two integrated circuits 41 are provided.

As illustrated in FIG. 7, the male inter-board connector 42 is mounted on the other surface of the control board 13. The male inter-board connector 42 is electrically connected to the female inter-board connector 35 of the power supply board 12, and thereby, the control board 13 and the power supply board 12 are electrically connected to each other. Note that the male inter-board connector 42 and the female inter-board connector 35 are floating connectors, and are electrically connected while absorbing an error at the time of fitting.

(Cross-Sectional Structure of Power Supply Board and Control Board)

Figure 8:
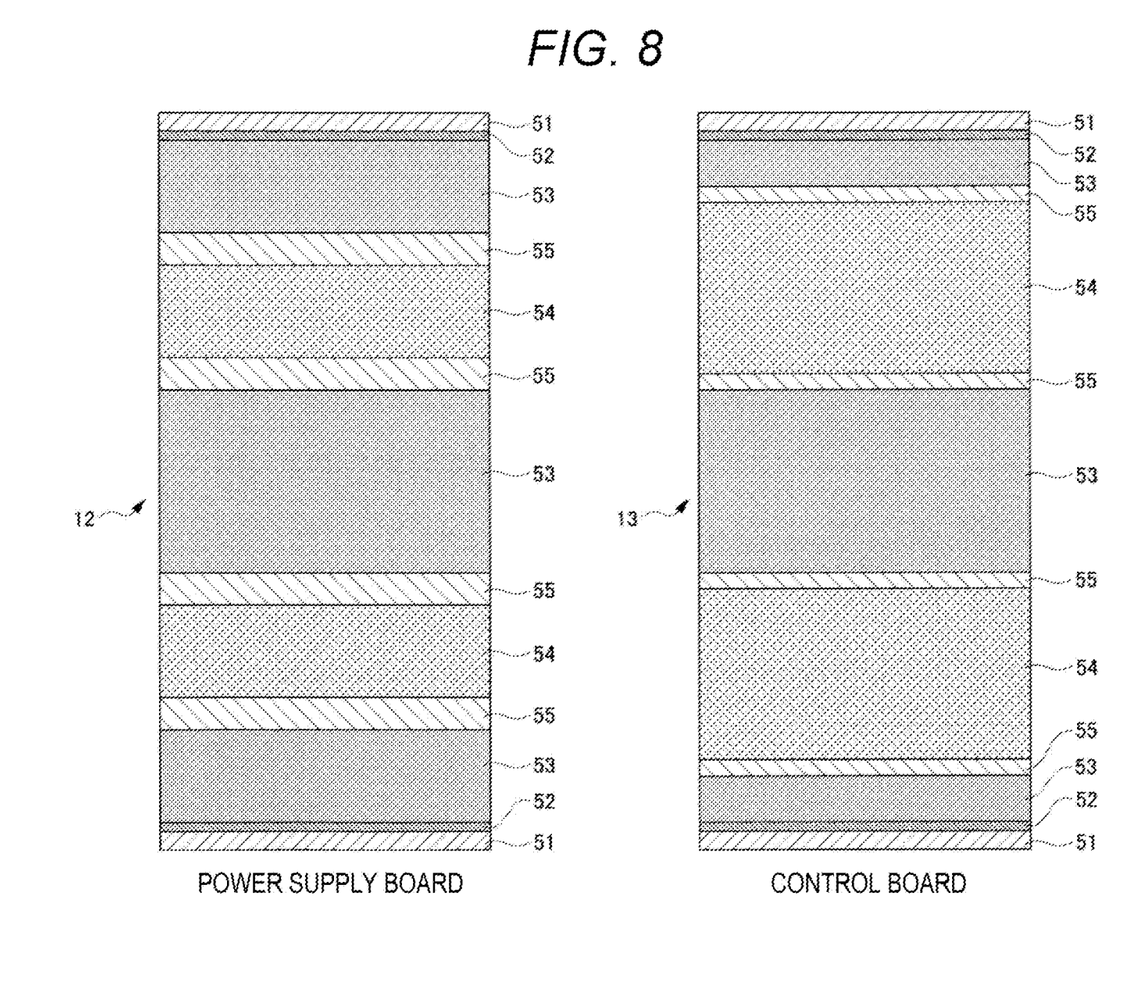
FIG. 8 is an explanatory diagram schematically illustrating cross sections of a power supply board and a control board according to an embodiment of the present invention.

FIG. 8 is an explanatory diagram schematically illustrating cross sections of the power supply board 12 and the control board 13 according to an embodiment of the present invention. As illustrated in FIG. 8, the power supply board 12 and the control board 13 are multilayer boards in which a cured layer and an inner-layer conductor are stacked.

The power supply board 12 and the control board 13 have the same layer structure, and include a solder resist (SR) 51 for coating a surface, a surface layer copper foil 52 covered with the SR 51, a first cured layer 53, a second cured layer 54, and a plurality of inner-layer copper foils 55 describing a specific example of an inner-layer conductor. The plurality of inner-layer copper foils 55 are interposed between the first cured layer 53 and the second cured layer 54.

The first cured layer 53 is a base material impregnated and cured with a thermosetting resin such as an epoxy resin, and is used for insulation. Similarly to the first cured layer 53, the second cured layer 54 is a base material impregnated and cured with a thermosetting resin such as an epoxy resin, and is harder than the first cured layer 53. The second cured layer 54 is provided to secure the strength of the boards 12 and 13.

All of the plurality of inner-layer copper foils 55 of the power supply board 12 have the same thickness, and are set to be thicker than the plurality of inner-layer copper foils 55 of the control board 13. The thickness of the second cured layer 54 of the power supply board 12 is smaller than the thickness of the second cured layer 54 of the control board 13, and the thickness of the entire power supply board 12 is equal to the thickness of the entire control board 13.

Since electric power is directly supplied from the connector 11 to the inner-layer copper foil 55 of the power supply board 12, the thickness of the inner-layer copper foil 55 of the control board 13 is preferably set to 1.7 to 2.3 times the thickness of the inner-layer copper foil 55 of the control board 13. The thickness of inner-layer copper foil 55 of the power supply board 12 may be set in consideration of the thickness of second cured layer 54 of first cured layer 53 necessary for securing the strength of power supply board 12.

[Assembly Procedure of Electronic Control Unit]

Next, an assembly procedure of the ECU 9 will be described. First, the power supply board 12 is attached to the board attachment portion 14a of the motor housing 14 using a screw. Next, the control board 13 is placed on the connector attachment portion 14b of the motor housing 14. As a result, the male inter-board connector 42 of the control board 13 is connected to the female inter-board connector 35 of the power supply board (refer to FIG. 7).

Next, the connector 11 is placed on one surface of the control board 13. As a result, the other end of the power supply terminal 26 and the other end of the GND terminal 27 of the connector 11 are connected to a power supply terminal connecting portion 31 and a GND terminal connecting portion 32 of the power supply board 12 (refer to FIG. 6). Thereafter, the connector and the control board 13 are attached to the connector attachment portion 14b using a screw. As a result, the ECU 9 is assembled.

As described above, when the connector 11 is attached to the connector attachment portion 14b, the power supply terminal 26 and the GND terminal 27 are connected to the power supply terminal connecting portion 31 and the GND terminal connecting portion 32. Therefore, the assembly work of the ECU 9 can be facilitated.

2. Summary

As described above, the ECU 9 (electronic control unit) according to the embodiment described above includes the connector 11 (connector) having the power supply terminal 26 (power supply terminal), the power supply board 12 (first board), and the control board 13 (second board). The power supply board includes an inner-layer copper foil 55 (inner-layer conductor), and a power conversion circuit that converts input power input via a power supply terminal 26 into predetermined output power is provided thereon. The control board 13 has an inner-layer copper foil 55, and is provided with an integrated circuit 41 (control circuit). In addition, a thickness of the inner-layer copper foil 55 of the power supply board 12 is thicker than a thickness of the inner-layer copper foil 55 of the control board 13.

As described above, since the power supply board 12 includes the inner-layer copper foil 55, it is possible to increase the number of wiring patterns without increasing the area of the power supply board 12, and it is possible to suppress an increase in size of the power supply board 12 and the ECU 9. In addition, by suppressing an increase in size of the power supply board 12 and the ECU 9, production costs of the power supply board 12 and the ECU 9 can be reduced.

In addition, the inner-layer copper foil 55 of the power supply board 12 is thicker than the inner-layer copper foil 55 of the control board 13, so that heat dissipation performance of the power supply board 12 to which power is directly supplied from the connector 11 can be improved. Furthermore, the electric resistance of the power supply board 12 is reduced, and the characteristic impedance can be improved.

In addition, the power supply board 12 (first board) of the ECU 9 (electronic control unit) according to the above-described embodiment includes the power supply terminal connecting portion 31 (terminal connecting portion) to which the power supply terminal 26 (power supply terminal) is connected. Further, the control board 13 (second board) is disposed between the connector 11 (connector) and the power supply board 12, and includes an interference avoidance portion 13a (interference avoidance portion) that avoids interference with the power supply terminal 26.

As a result, it is not necessary to increase the size of the connector 11 and the power supply board 12 in order to avoid interference between the power supply terminal 26 and the control board 13, and it is possible to reduce the size of the connector 11 and the power supply board 12.

In addition, the ECU 9 (electronic control unit) according to the embodiment described above includes a board attachment portion 14a (board attachment portion) to which the power supply board 12 (first board) is attached, and a connector attachment portion 14b (connector attachment portion) to which the connector 11 (connector) is attached. When the connector 11 is attached to the connector attachment portion 14b, the power supply terminal 26 (power supply terminal) is connected to the power supply terminal connecting portion 31 (terminal connecting portion). Thus, the assembly work of the ECU 9 can be facilitated.

In addition, the connector 11 (connector) of the ECU 9 (electronic control unit) according to the above-described embodiment includes a plurality of control terminals 29 (control terminals) and a plurality of CAN communication terminals 28 (communication terminals) connected to the control board 13 (second board). The other ends (ends connected to the second board) of the plurality of control terminals 29 are arranged in a predetermined direction. The other ends (ends connected to the second board) of the CAN communication terminals 28 are arranged in a predetermined direction. In addition, the other ends of the plurality of control terminals 29 and the other ends of the plurality of CAN communication terminals 28 are arranged in a straight line in a predetermined direction. As a result, the position of the other end of each of the terminals 28 and 29 can be adjusted by one adjustment jig. As a result, the other ends of the terminals 28 and 29 can be easily connected to the control board 13, and the assembly work of the ECU 9 can be facilitated.

In addition, one ends (ends on a side opposite to a side connected to the second board) of the plurality of CAN communication terminals 28 (communication terminals) of the ECU (electronic control unit) according to the above-described embodiment are arranged along a specific direction different from the predetermined direction. As a result, one end (input side) of each of the plurality of CAN communication terminals 28 can be disposed at a position corresponding to an electrical connector of an external device (for example, a power battery). That is, even if the terminals connected to the plurality of control terminals 29 and the plurality of CAN communication terminals 28 in the electrical connector of the external device are not arranged on a straight line, the output sides of the plurality of control terminals 29 and the plurality of CAN communication terminals 28 can be arranged on a straight line.

In addition, the inner-layer copper foil 55 (inner-layer conductor) of the power supply board 12 (first board) and the inner-layer copper foil 55 (inner-layer conductor) of the control board 13 (second board) in the ECU 9 (electronic control unit) according to the above-described embodiment are made of copper. As a result, the heat dissipation performance and the characteristic impedance of the power supply board 12 and the control board 13 are improved, and the production cost can be reduced by using a relatively inexpensive copper material among metal materials.

In addition, the power supply board 12 (first board) and the control board 13 (second board) of the ECU 9 (electronic control unit) according to the above-described embodiment are formed by stacking the first cured layer 53 and the second cured layer 54 (cured layer) obtained by containing and curing a thermosetting resin and the inner-layer copper foil 55 (inner-layer conductor). Accordingly, even when the wiring patterns of the power supply board 12 and the control board 13 are increased, it is possible to suppress an increase in size of the power supply board 12, the control board 13, and the ECU 9.

In addition, the thickness of the inner-layer copper foil (inner-layer conductor) of the power supply board 12 (first board) in the ECU 9 (electronic control unit) according to the above-described embodiment is 1.7 to 2.3 times the thickness of the inner-layer copper foil 55 (inner-layer conductor) of the control board 13 (second board). As a result, the strength of the power supply board 12 can be secured, and the thickness of the entire power supply board 12 can be made equal to the thickness of the entire control board 13.

In addition, the power supply board 12 (first board) of the ECU 9 (electronic control unit) according to the above-described embodiment includes a plurality of inner-layer copper foils 55 (inner-layer conductors), and all the inner-layer conductors of the power supply board 12 are thicker than the inner-layer copper foils 55 (inner-layer conductors) of the control board 13 (second board). As a result, the number of wiring patterns of the power supply board 12 can be increased, and it is possible to suppress an increase in size of the power supply board 12 and the ECU 9.

The embodiments of the electronic control unit of the present invention have been described above including the operational effects thereof. However, the electronic control unit of the present invention is not limited to the above-described embodiment, and various modifications can be made without departing from the gist of the invention described in the claims. For embodiment, the above-described embodiments are described in detail in order to describe the present invention in an easy-to-understand manner, and are not necessarily limited to those having all the described configurations.

For example, in the above-described embodiment, the male inter-board connector 42 is mounted on the control board 13, and the female inter-board connector 35 is mounted on the power supply board 12. However, in the electronic control unit according to the present invention, the female inter-board connector 35 may be mounted on the control board 13, and the male inter-board connector 42 may be mounted on the power supply board 12. Further, the inter-board connector according to the present invention is not limited to the floating connector, and may be, for example, a ridge type connector that does not move in any fitting direction.

In the embodiment described above, the board attachment portion 14a and the connector attachment portion 14b are integrated with the motor housing 14. However, in the electronic control unit according to the present invention, the board attachment portion and the connector attachment portion may be provided separately from the motor housing 14. In this case, for example, the electronic control unit including the board attachment portion and the connector attachment portion may be assembled, and then the electronic control unit may be attached to the motor housing 14.

In the above-described embodiment, one end of the power supply terminal 26, one end of the GND terminal 27, and one end of the CAN communication terminal 28 are disposed in the connector housings 22 and 23. However, as the connector according to the present invention, one end of the CAN communication terminal may be disposed in a connector housing different from the connector housing in which one end of the power supply terminal and one end of the GND terminal are disposed.

In the embodiment described above, the power supply board 12 and the control board 13 have the inner-layer copper foil 55. However, the power supply board (first board) and the control board (second board) according to the present invention are not limited to the copper foil as an inner-layered conductor, and other conductors may be inner-layered. In addition, the cured layer according to the present invention is not limited to one impregnated with a thermosetting resin and cured, and other resins having insulating properties may be applied.

In the above embodiment, the total number of the inner-layer copper foils 55 of the power supply board 12 is equal to the total number of the inner-layer copper foils 55 of the control board 13. However, the total number of the inner-layer copper foils 55 of the power supply board 12 and the total number of the inner-layer copper foils 55 of the control board 13 according to the present invention can be appropriately set according to the number of wiring patterns to be formed, and are not necessarily the same. The thickness of the entire power supply board according to the present invention may be different from the thickness of the entire control board.

REFERENCE SIGNS LIST

1 electric power steering device
2 steering shaft
3 tie rod
4 rack housing
rubber boot
6 electric drive device
7 torque sensor
8 electric motor unit
9 ECU (electronic control unit)
10 gear
11 connector
12 power supply board
13 control board
13a interference avoidance portion
14 motor housing
14a board attachment portion
14b connector attachment portion
15 cover
21 flange
22, 23, 24, 25 connector housing
26 power supply terminal
27 GND terminal
28 CAN communication terminal (communication terminal)
29 control terminal
31 power supply terminal connecting portion
32 GND terminal connecting portion
33 capacitor 34 magnetic sensor
35 female inter-board connector
37 plurality of through holes
41 integrated circuit
42 male inter-board connector
51 SR (solder resist)
52 surface layer copper foil
53 first cured layer
54 second cured layer
55 inner-layer copper foil (inner-layer conductor)

The invention claimed is:

1. An electronic control unit comprising:
a connector including a power supply terminal;
   a first board including an inner-layer conductor and provided with a power conversion circuit that converts input power input via the power supply terminal into predetermined output power; and
   a second board including an inner-layer conductor and provided with a control circuit,
   wherein a thickness of the inner-layer conductor of the first board is thicker than a thickness of the inner-layer conductor of the second board, and
   wherein the thickness of the inner-layer conductor of the first board is 1.7 to 2.3 times the thickness of the inner-layer conductor of the second board.

2. The electronic control unit according to claim 1, wherein
the first board includes a terminal connecting portion to which the power supply terminal is connected, and
the second board is disposed between the connector and the first board, and includes an interference avoidance portion that avoids interference with the power supply terminal.

3. The electronic control unit according to claim 2, further comprising:
   a board attachment portion to which the first board is attached; and
   a connector attachment portion to which the connector is attached,
   wherein the power supply terminal is connected to the terminal connecting portion when the connector is attached to the connector attachment portion.

4. The electronic control unit according to claim 1, wherein
the connector includes a plurality of control terminals and a plurality of communication terminals connected to the second board,
   ends of the plurality of control terminals connected to the second board are arranged in a predetermined direction,
   ends of the plurality of communication terminals connected to the second board are arranged in the predetermined direction, and
   the ends of the plurality of control terminals connected to the second board and the ends of the plurality of communication terminals connected to the second board are arranged in a straight line in the predetermined direction.

5. The electronic control unit according to claim 4, wherein ends of the plurality of communication terminals on a side opposite to a side connected to the second board are arranged along a specific direction different from the predetermined direction.

6. The electronic control unit according to claim 1, wherein the inner-layer conductor of the first board is made of copper.

7. The electronic control unit according to claim 6, wherein the inner-layer conductor of the second board is made of copper.

8. The electronic control unit according to claim 1, wherein the first board is formed by stacking a cured layer obtained by containing and curing a thermosetting resin, and the inner-layer conductor.

9. The electronic control unit according to claim 8, wherein the second board is formed by stacking a cured layer obtained by containing and curing a thermosetting resin, and the inner-layer conductor.

10. The electronic control unit according to claim 1, wherein
the first board includes a plurality of the inner-layer conductors, and
all the inner-layer conductors of the first board are thicker than the thickness of the inner-layer conductors of the second board.

11. An electronic control unit comprising:
a connector including a power supply terminal;
   a first board including an inner-layer conductor and provided with a power conversion circuit that converts input power input via the power supply terminal into predetermined output power; and
   a second board including an inner-layer conductor and provided with a control circuit, wherein
   a thickness of the inner-layer conductor of the first board is thicker than a thickness of the inner-layer conductor of the second board,
   the connector includes a plurality of control terminals and a plurality of communication terminals connected to the second board,
   ends of the plurality of control terminals connected to the second board are arranged in a predetermined direction,
   ends of the plurality of communication terminals connected to the second board are arranged in the predetermined direction,
   the ends of the plurality of control terminals connected to the second board and the ends of the plurality of communication terminals connected to the second board are arranged in a straight line in the predetermined direction, and
   ends of the plurality of communication terminals on a side opposite to a side connected to the second board are arranged along a specific direction different from the predetermined direction.

* * * * *